(12) United States Patent
Wacquez et al.

(10) Patent No.: US 8,110,460 B2
(45) Date of Patent: Feb. 7, 2012

(54) METHOD FOR PRODUCING STACKED AND SELF-ALIGNED COMPONENTS ON A SUBSTRATE

(75) Inventors: Romain Wacquez, Grenoble (FR);
Philippe Coronel, Barraux (FR);
Vincent Destefanis, Grenoble (FR);
Jean-Michel Hartmann, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 64 days.

(21) Appl. No.: 12/577,379

(22) Filed: Oct. 12, 2009

(65) Prior Publication Data
US 2010/0099233 A1 Apr. 22, 2010

(30) Foreign Application Priority Data
Oct. 17, 2008 (FR) ..................................... 08 57060

(51) Int. Cl.
*H01L 21/8238* (2006.01)
(52) U.S. Cl. ............................... 438/200; 257/E21.207
(58) Field of Classification Search .................. 438/50, 438/200, 279, 283, 588; 257/E21.207
See application file for complete search history.

(56) References Cited

U.S. PATENT DOCUMENTS

| 7,247,896 B2 * | 7/2007 | Oh et al. ...................... 257/288 |
| 7,351,622 B2 * | 4/2008 | Buh et al. ...................... 438/157 |
| 2004/0016968 A1 | 1/2004 | Coronel et al. |
| 2005/0020085 A1 | 1/2005 | Lee et al. |
| 2007/0190787 A1 | 8/2007 | Loubet et al. |
| 2007/0194355 A1 | 8/2007 | Wacquez et al. |
| 2009/0079004 A1 | 3/2009 | Licitra et al. |

FOREIGN PATENT DOCUMENTS

| FR | 2 838 238 A1 | 10/2003 |
| FR | EP 1 788 635 A1 | 5/2007 |
| FR | 2 897 201 A1 | 8/2007 |
| FR | EP 1 881 533 A2 | 1/2008 |
| FR | EP 1 881 533 A3 | 1/2008 |

* cited by examiner

*Primary Examiner* — Chandra Chaudhari
(74) *Attorney, Agent, or Firm* — Oblon, Spivak, McClelland, Maier & Neustadt, L.L.P.

(57) ABSTRACT

A method for producing stacked and self-aligned components on a substrate, including: providing a substrate made of monocrystalline silicon having one face enabling production of components, forming a stack of layers on the face of the substrate, selective etching by a gaseous mixture comprising gaseous HCl conveyed by a carrier gas and at a temperature between 450° C. and 900° C., depositing resin, implementing lithography of the resin, replacing resin eliminated during the lithography with a material for confining remaining resin, and forming elements of the components.

15 Claims, 4 Drawing Sheets

METHOD FOR PRODUCING STACKED AND SELF-ALIGNED COMPONENTS ON A SUBSTRATE

TECHNICAL FIELD

The invention relates to a method for producing stacked and self-aligned components on a substrate.

It applies in particular, but not exclusively, to the formation of self-aligned stacked functions constituting electronic components or parts thereof, elements of MEMS, etc.

STATE OF THE PRIOR ART

The formation of components stacked one above the other has known a certain success, whether in microelectronics or in other fields (MEMS, etc.). It is even possible to stack components such as transistors and MEMS. This concept however often draws upon methods that are complex, high in thermal budget and/or costly (re-crystallisation of silicon, molecular bonding, re-growth through a contact, numerous lithographies, etc.).

Among the known techniques for forming stacked functions, the following techniques may be cited.

A first technique implements a repeat epitaxy through contact holes. The epitaxial growth is laser assisted. This technique has been proposed within the scope of forming 3D SRAM. Reference may be made in this respect to the follow publication: "High Speed and Highly Cost effective 72M bit density S$^3$SRAM Technology with Doubly Stacked Si Layers, Peripheral only CoSix layers and Tungsten Shunt W/L Scheme for Standalone and Embedded Memory" of S.-M. JUNG et al., VLSI Technology, 2007 IEEE Symposium on, 12-14 Jun. 2007, pages 82-83.

Moreover, a technique that makes it possible to align components together is known. It comprises the following steps:

firstly a bridge is formed, constituted of a thin film, above a substrate, a layer of resin is deposited on the substrate, the bridge being immersed in the resin, the resin is locally subjected to a beam of electrons sufficiently powerful to pass through the thin film and obtain in alignment resin zones subjected to the beam of electrons below and above the bridge, the resin is developed so as to only keep resin zones aligned above and below the bridge.

This technique is in particular exploited in document FR-A-2 858 876 corresponding to document US 2005/0037603.

Moreover, a method of selective etching of SiGe compared to silicon by means of HCl gas is known. The rate of etching of SiGe, selectively compared to silicon, using HCl gas, is particularly a function of the etching temperature and the percentage of germanium in the SiGe. Reference may be made in this respect to document US 2007/0190787.

DESCRIPTION OF THE INVENTION

As described previously, the formation of self-aligned stacked functions necessitates the use of high thermal budget methods (re-crystallisation of silicon through contact holes), complex methods (laser assisted epitaxial growth) or expensive methods (use of several sets of lithography masks).

The present invention describes a method for stacking, on several levels (at least two), components that are self-aligned and electrically isolated from each other (semiconductors, microresonators, etc.) by an insulator layer. No method of recrystallisation of silicon, regrowth through a contact is necessary, thereby limiting the thermal budget constraints. The stacks are defined as of the first operation by epitaxy. Selective etchings and the use of self-aligned lithography then make it possible to work through the membrane.

The object of the invention is a method for producing stacked and self-aligned components on a substrate, comprising the following steps:

providing a substrate made of monocrystalline silicon having one face enabling the production of a component, forming a stack of layers on the face of the substrate, the stack comprising a first sacrificial layer made of monocrystalline SiGe formed on the face of the substrate, a second sacrificial layer made of monocrystalline SiGe formed on the first sacrificial layer, the germanium concentration of the first sacrificial layer being between 30% and 100%, the germanium concentration of the second sacrificial layer being between 10% and 30%, the germanium concentration of the first sacrificial layer being at least 15% greater than the germanium concentration of the second sacrificial layer, and a superficial layer made of monocrystalline silicon enabling the production of a component and formed on the second sacrificial layer, said layers of the stack being formed so as to enable an access to at least one zone of the first sacrificial layer and to at least one zone of the second sacrificial layer, these zones being stacked, selective etching of said zone of the first sacrificial layer by a gaseous mixture comprising gaseous HCl conveyed by a carrier gas and at a temperature between 450° C. and 900° C., the second sacrificial layer and the superficial layer forming a bridge above the etched zone of the first sacrificial layer, depositing resin in the etched zone of the first sacrificial layer and on the superficial layer, the resin being a resin that transforms into dielectric material after annealing, lithography of the resin deposited at the preceding step to leave remaining at least one resin zone in the etched zone of the first sacrificial layer, in alignment with at least one resin zone on the superficial layer, replacing the resin eliminated during the lithography step in the etched zone of the first sacrificial layer and on the superficial layer by a material for confining the remaining resin, eliminating the resin zones remaining in the etched zone of the first sacrificial layer and on the superficial layer to provide zones dedicated to the production of components, forming elements of components in the dedicated zones, selective etching of said zone of the second sacrificial layer, the superficial layer forming a bridge above said etched zone of the second sacrificial layer.

The step of providing a substrate may consist in providing a substrate chosen among a solid silicon substrate, an SOI substrate, an sSOI substrate, an XsSOI substrate and a virtual SiGe substrate. Said face of the substrate may comprise at least one component or at least one part of component.

Preferably, the resin deposited in the etched zone of the first sacrificial layer and the resin deposited on the superficial layer are a resin that transforms into dielectric material after exposure and/or annealing, for example an HSQ (hydrogen silsesquioxane) resin.

The confinement material may be silicon nitride.

According to one embodiment, the step of forming elements of components comprises the formation of at least one transistor gate element.

According to an alternative embodiment, the step of selective etching of said zone of the second sacrificial layer is followed by a step of filling the etched zone of the second sacrificial layer with an electrically isolating material. This material may be silicon oxide.

A step of eliminating the confinement material may be provided.

The lithography step may be carried out by means of a beam of electrons passing through the second sacrificial layer.

It may also be carried out by means of an electromagnetic radiation of wavelength between 0.1 nm and 41 nm, the thickness and the nature of the resin deposited on the superficial layer as well as the thickness of the superficial layer being chosen so that at least 50% of the electromagnetic radiation applied to the resin deposited on the superficial layer is transmitted to the resin deposited in the etched zone of the first sacrificial layer. According to one specific embodiment, the wavelength of the electromagnetic radiation is between 12.5 nm and 15 nm.

BRIEF DESCRIPTION OF DRAWINGS

The invention will be better understood and other advantages and particularities will become clear on reading the following description, given by way of non limiting example, and by referring to the appended drawings, among which.

DETAILED DESCRIPTION OF SPECIFIC EMBODIMENTS

FIGS. 1A to 1J are cross-sectional views illustrating different steps of an embodiment of the method for producing stacked and self-aligned components on a substrate, according to the invention. For reasons of simplification, the production of a single component is represented.

Figure 1A:
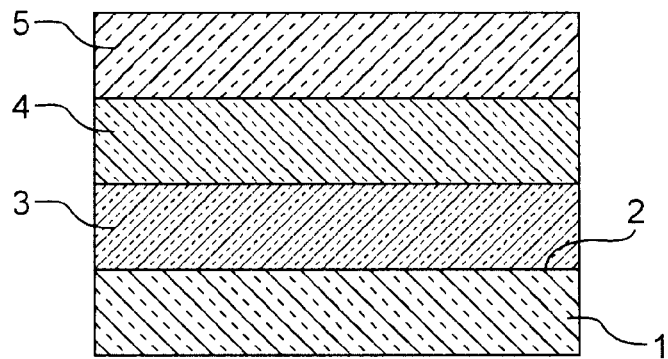
FIGS. 1A to 1J are cross-sectional views illustrating different steps of an embodiment of the method for producing stacked and self-aligned components on a substrate, according to the invention.

FIG. 1A shows a substrate 1 having one face 2 enabling the production of a component. A stack of layers is formed on the face 2 of the substrate 1. The stack comprises a first sacrificial layer 3 formed on the face 2 of the substrate 1, a second sacrificial layer 4 formed on the first sacrificial layer 3 and a superficial layer 5 enabling the production of a component and formed on the second sacrificial layer 4.

The different layers of the stack are formed so as to enable an access to at least one zone of the first sacrificial layer 3 and to at least one zone of the second sacrificial layer 4. In this embodiment example, the superficial layer 5 has at least one zone, not represented in FIG. 1A, rendering it integral with the substrate 1 outside of the sacrificial layers 3 and 4.

Access to the zones to be selectively etched may be achieved by photo-lithography steps followed by etching steps. It may also be achieved by technological steps leading to the formation of SON (Silicon On Nothing) or LSOI (Localized Silicon On Insulator) architectures. For the SON architecture, reference may be made to the article "Silicon-on-Nothing (SON)—an innovative process for advanced CMOS" of M. JURCZAK et al., IEEE Transactions on Electron Devices, vol. 47, no 11, pages 2179 to 2187, November 2000. For the LSOI architecture, reference may be made to the article "Localized SOI Technology: an innovative Low Cost self-aligned process for Ultra Thin Si-Film on thin BOX integration for Low Power applications" of S. MONFRAY et al., Electron Devices Meeting, 2007, IEDM 2007, IEEE International, pages 693 to 696, 10-12 Dec. 2007, and document US 2007/0190754.

In the embodiment example that is the object of FIGS. 1A to 1J, the substrate 1 is a solid monocrystalline silicon substrate, the sacrificial layers 3 and 4 are made of monocrystalline SiGe with different Ge concentrations and the superficial layer 5 is made of monocrystalline silicon. The sacrificial layer 3 has a Ge concentration greater than the Ge concentration of the sacrificial layer 4. The sacrificial layer 3 will be known as of high Ge concentration whereas the sacrificial layer 4 will be known as of low Ge concentration.

This difference in Ge concentration of the sacrificial layers 3 and 4 will enable a selective etching of the sacrificial layer 3 compared to the sacrificial layer 4 and enable this in the presence of monocrystalline silicon.

The sacrificial layers 3 and 4 and the superficial layer 5 may be formed on the face 2 of the substrate 1 by epitaxy according to techniques known to those skilled in the art.

Figure 1B:
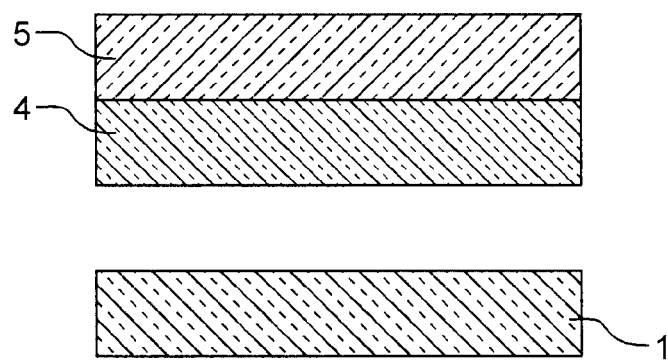
Figure 1C:
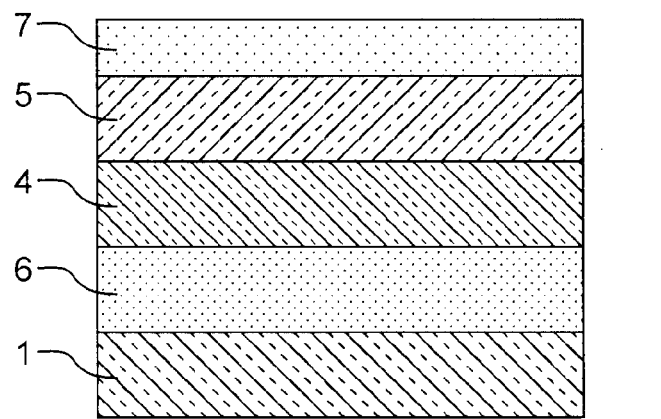
Figure 1D:
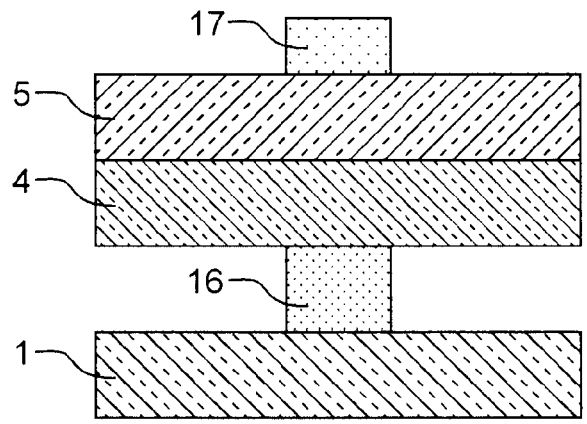

A step of selective etching is then carried out, which makes it possible to eliminate the sacrificial layer 3 as shown in FIG. 1B.

The etching is carried out by a chemical vapour etching (CVE) using as etching gas hydrochloric acid HCl mixed with a carrier gas, at an etching temperature less than or equal to 700° C.

This selective etching does not contaminate in any case the self-aligned functions formed. It is simple to implement. It seems impossible to form, according to the prior art, by etching methods by $CF_4$/Ar plasma method or by wet method. The etching will be carried out in the presence of a carrier gas, for example hydrogen or nitrogen.

The germanium concentration of the sacrificial layer of high Ge concentration (layer 3) is greater than or equal to 30% whereas the Ge concentration of the sacrificial layer of low Ge concentration (layer 4) is greater than or equal to 10% and less than 30%. The difference in germanium concentration between the two sacrificial layers is at least 15%.

The thickness of the sacrificial layer 3 is between 5 nm and 30 nm. The thickness of the sacrificial layer 4 is between 5 nm and 100 nm.

The thicknesses of the sacrificial layers made of SiGe are chosen so as not to generate defects in the stack and to maintain a good etching selectivity between the high germanium concentration layer and low germanium concentration layer. The ratio of the "low Ge concentration SiGe layer/high Ge concentration SiGe layer" thicknesses may be between 1/6 and 20. Advantageously, this ratio is greater than or equal to 1. This makes it possible to conserve a good etching selectivity between the layers of SiGe.

Those skilled in the art will know how to adapt the thicknesses of the sacrificial layers and their germanium concentration so as not to cause a plastic relaxation in these layers in order not to generate crystalline defects in the stack, which would be detrimental to the correct operation of the components to be formed.

The etching temperature is between 450° C. and 900° C. Advantageously, the etching temperature will be chosen less than or equal to 700° C. At this temperature, the etching, in addition to being selective between two SiGe layers with different Ge concentrations, is extremely selective vis-à-vis the surrounding silicon (substrate and superficial layer), the rate of etching of silicon being negligible (less than 0.1 nm/min).

The total pressure of the gaseous mixture during the etching is for example between 200 and 101 300 Pa. The partial pressure of hydrogen may lie in the range extending from 20 to 24 000 Pa. The flow of the gaseous etching mixture will be between several standard liters and several tens of standard liters per minute. The flow of HCl will be between several hundreds of centimeters cube per minute and several tens of standard liters per minute. The etching time will lie between several seconds and several hundreds of seconds.

Low pressures, advantageously several thousands of Pa in total pressure and several tens of Pa in partial pressure of HCl may be chosen so as to improve the etching selectivity between the sacrificial layers. Quite the reverse, high etching pressures may be chosen (advantageously several tens of thousands of Pa in total pressure and partial pressure) so as to obtain a very good rate of etching. Those skilled in the art will know how to adapt the etching temperatures and pressures so as to conserve significant selectivities and significant etching rates for the SiGe layers, in other words greater than 0.1 nm/min, and also to find a good compromise between rate of etching and selectivity.

The greater the difference in concentration between the two SiGe layers, the better the etching selectivity. The higher the proportion of germanium in the high Ge concentration SiGe layer, the more it is possible to reduce the etching temperature and pressure in order to better control selectivity. Finally, an increase in the total pressure, and more particularly the partial pressure of HCl, increases the etching rates but degrades the selectivity between the SiGe layers at given concentration difference. The use of an original starting substrate, other than solid silicon, for example "strained SOI", "buffer SiGe", etc., will make it possible to increase the degrees of freedom on the thicknesses and the Ge concentrations of the layers deposited and to obtain better etching selectivities. The user of said method will know how to find the conditions (temperature and pressure), particularly the composition of the SiGe layers to obtain the requisite etching rates and selectivities.

At the end of this selective etching step, the second sacrificial layer 4 and the superficial layer 5 form a bridge above the etched zone of the first sacrificial layer.

The following step comprises the deposition of a resin in the etched zone of the first sacrificial layer and on the superficial layer to coat the superficial layer. FIG. 1O shows the structure obtained, which comprises a layer of resin 6, between the substrate 1 and the second sacrificial layer 4, and a layer of resin 7 covering the superficial layer 5.

The resin forming the layers 6 and 7 is a resin that transforms into dielectric material after annealing. The fact of obtaining a dielectric layer allows the structure to withstand the thermal budget of the method. Preferably, an HSQ (hydrogen silsesquioxane) resin will be chosen, which makes it possible to withstand the thermal budget induced by the following steps of the method. The resin may be deposited at 2 000 turns/minute.

A step of lithography of the resin deposited at the preceding step is then carried out, for example, by means of a beam of electrons that will sensitise simultaneously the resin layer 7 and the resin layer 6, after passing through the superficial layer 5 and the second sacrificial layer 4. The beam of electrons will have an energy greater than 10 keV, for example an energy of 100 keV for 700 μC/Cm². In this embodiment example is obtained, at the development of the resin, a resin zone 16, transformed into a dielectric material, in the etched zone of the first sacrificial layer in alignment with a resin zone 17 on the superficial layer 5 (see FIG. 1D).

The lithography step may also be carried out by means of an electromagnetic radiation of wavelength between 0.1 nm and 41 nm, preferably of wavelength between 12.5 nm and 15 nm. The nature and the thickness of the resin layer deposited on the superficial layer as well as the thickness of the superficial layer are chosen so that at least 50% of the electromagnetic radiation applied to the resin deposited on the superficial layer is transmitted to the resin deposited on the etched zone of the first sacrificial layer.

Figure 1E:
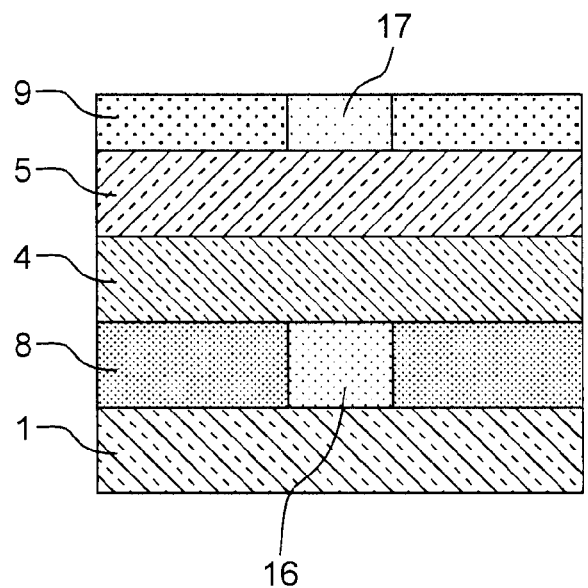

The resin eliminated during the lithography step in the etched zone of the first sacrificial layer and on the superficial layer 5 is replaced by a material for confining the resin zones 16 and 17. The confinement material is for example silicon nitride. This material may be deposited by LPCVD. FIG. 1E shows the structure obtained, a layer 8 confining the resin zone 16 between the substrate 1 and the second sacrificial layer 4, a layer 9 confining the resin zone on the superficial layer 5. A chemical mechanical polishing (CMP) operation makes it possible to reveal the zone of resin 17 transformed into dielectric material.

Figure 1F:
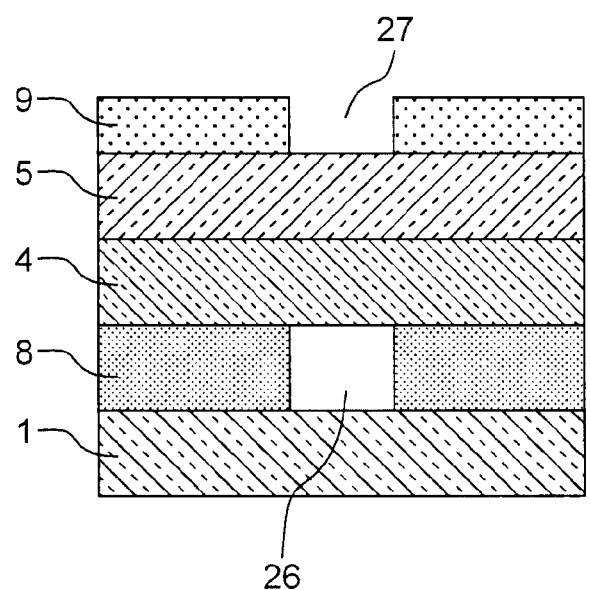

The etching of the remaining resin zones 16 and 17 is then carried out. If the resin used is HSQ, a wet HF etching may be employed. As shown in FIG. 1F, etched and aligned zones 26 and 27 are obtained.

Figure 1G:
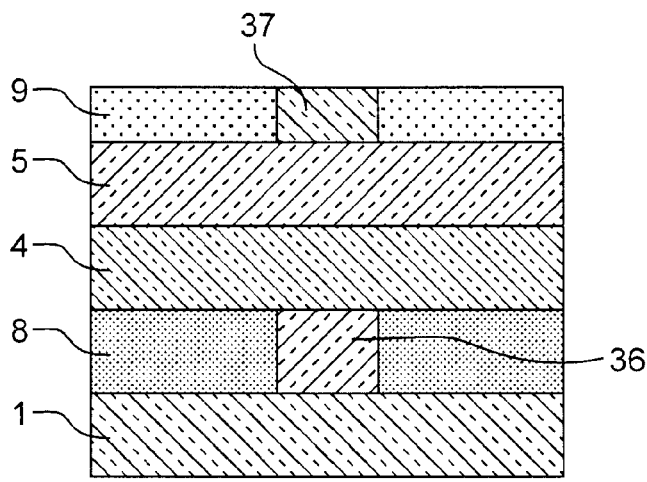

The structure is ready to receive component elements in the etched and aligned zones. These component elements, referenced 36 and 37 in FIG. 1G, are for example constituted of layers deposited to form gate stackings, for example HfO₂, TiN, polycrystalline silicon stackings. As for the etching of the resin zone 16 (see FIG. 1E), the constitution of the element 36 is possible from an access provided during the formation of the different layers of the stack of the sacrificial layers and of the superficial layer.

Figure 1H:
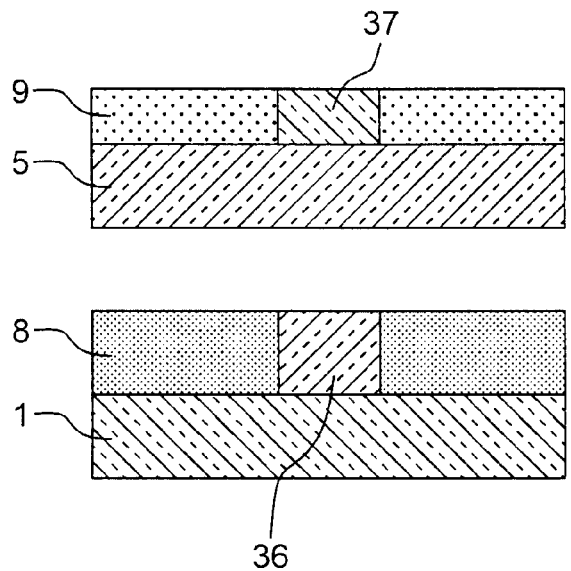

The elimination of the second sacrificial layer is then carried out to obtain the structure represented in FIG. 1H, for example by means of a CF₄ isotropic plasma. The superficial layer 5 then forms a bridge above the etched zone of the second sacrificial layer.

Figure 1I:
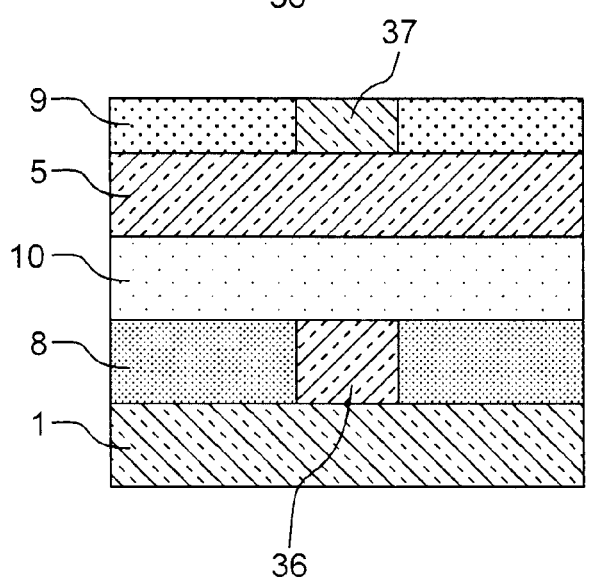

At the location of the second sacrificial layer, a dielectric material, serving to electrically isolate the future components from each other, is introduced to fill the space separating the layer 8 for confining the superficial silicon layer 5. It is for example a layer of silicon oxide 10 (HTO layer for High Temperature Oxide) formed by LPCVD. FIG. 1I shows the structure obtained. The thickness of the sacrificial layer 4, defining the thickness of the dielectric layer 10, will be chosen as thick as possible to reduce to the minimum the coupling between the stacked devices.

Figure 1J:
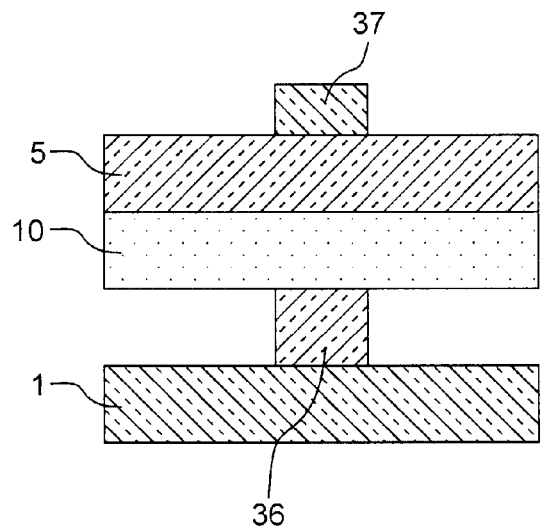

The confinement layers are then eliminated by isotropic etching, for example by a solution of H₃PO₄, to provide the structure represented in FIG. 1J and having self-aligned gate stackings 36 and 37.

The method may then be continued by steps known to those skilled in the art (forming spacers, etc.).

The embodiment example described previously began with a solid substrate made of monocrystalline silicon. In the case of silicon, other substrates may be used. Apart from the Si(001) substrate, sSOI, XsSOI substrates or virtual SiGe substrates may be used to increase the degree of freedom on the thicknesses, the Ge concentrations of the intermediate layers and to obtain the best etching selectivities. Using substrates of orientation other than (001), for example Si(110), Si(111), etc. could also be envisaged.

Figure 2:
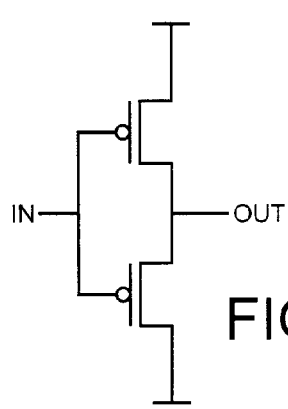
FIG. 2 is an electrical diagram of an inverter formed in CMOS technology.

An example of application of the present invention will be given below with reference to FIGS. 2, 3A and 3B.

The inverter is the fundamental logic gate in CMOS technology. It is composed of an NMOS transistor and a PMOS transistor connected as indicated in the diagram of FIG. 2. The input of the inverter is known as IN and its output is known as OUT.

Figure 3B:
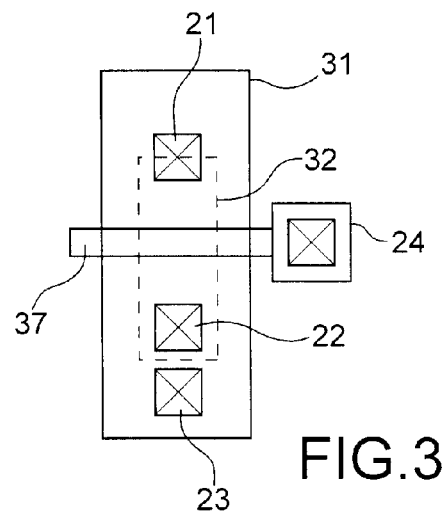
FIGS. 3A and 3B are respectively cross-sectional and top views of a CMOS inverter stacked on two levels, according to the present invention.
Figure 3A:
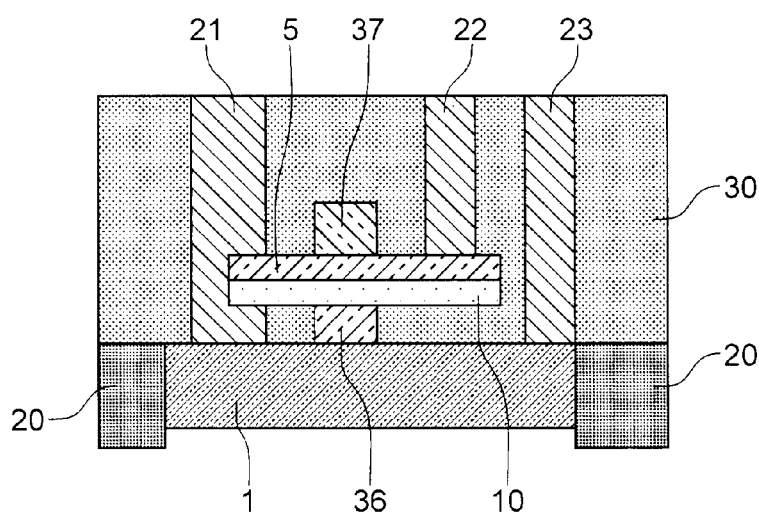

FIGS. 3A and 3B are respectively cross-sectional and top views of a CMOS inverter stacked on two levels, according to the present invention.

In FIG. 3A, the different elements of the structure represented in FIG. 1J are represented with the same references. The structure is electrically isolated from the other components formed on the substrate 1 by isolation trenches 20 known as STI (Shallow Trench Isolation).

The references 21, 22 and 23 designate electrical connections to the transistors. The connection 21 connects the drain of one of the transistors to the source of the other transistor and assures the OUT output of the inverter. The transistor gates are at the same potential.

The coating material, referenced 30 in FIG. 3A, may be a low density material, for example $SiO_2$.

In the top view represented in FIG. 3B are shown the connections 21, 22 and 23 and the gate stack 37. The reference 24 represents the contact common to the two gates. The references 31 and 32 represent respectively the active zones of the substrate, for example PMOS, and the superficial layer, for example NMOS.

A particular structure has been formed under the following conditions:
Si substrate,
first sacrificial layer made of SiGe with 40% Ge, of 23 nm thickness,
second sacrificial layer made of SiGe with 20% Ge, of 38 nm thickness,
superficial layer of Si, of 33 nm thickness,
encapsulation by silicon nitride of 40 nm thickness.

The etching temperatures applied lie between 550 and 600° C. The carrier gas used was hydrogen whereas the etching gas was HCl. The partial pressures of HCl and $H_2$ were around 24 000 Pa and 16 000 Pa, respectively.

The invention claimed is:

1. A method for producing stacked and self-aligned components on a substrate, comprising the following steps:
providing a substrate made of monocrystalline silicon having one face enabling production of components,
forming a stack of layers on the face of the substrate, the stack comprising a first sacrificial layer made of monocrystalline SiGe formed on the face of the substrate, a second sacrificial layer made of monocrystalline SiGe formed on the first sacrificial layer, a germanium concentration of the first sacrificial layer being between 30% and 100%, a germanium concentration of the second sacrificial layer being between 10% and 30%, the germanium concentration of the first sacrificial layer being at least 15% greater than the germanium concentration of the second sacrificial layer, and a superficial layer made of monocrystalline silicon enabling the production of the component and formed on the second sacrificial layer, said layers of the stack being formed so as to enable an access to at least one zone of the first sacrificial layer and to at least one zone of the second sacrificial layer, these zones being stacked,
selective etching of said zone of the first sacrificial layer by a gaseous mixture comprising gaseous HCl conveyed by a carrier gas and at a temperature between 450° C. and 900° C., the second sacrificial layer and the superficial layer forming a bridge above an etched zone of the first sacrificial layer,
depositing resin in the etched zone of the first sacrificial layer and on the superficial layer, the resin being a resin that transforms into dielectric material after annealing,
implementing lithography of the resin deposited at the depositing step to leave remaining at least one zone of resin in the etched zone of the first sacrificial layer, in alignment with at least one zone of resin on the superficial layer,
replacing resin eliminated during the lithography in the etched zone of the first sacrificial layer and on the superficial layer with a material for confining remaining resin,
eliminating zones of the remaining resin in the etched zone of the first sacrificial layer and on the superficial layer to provide zones dedicated to the production of the components,
forming elements of the components in the dedicated zones, and
selective etching of said zone of the second sacrificial layer, the superficial layer forming a bridge above said etched zone of the second sacrificial layer.

2. The method of production according to claim 1, wherein the step of providing a substrate consists in providing a substrate chosen among a solid silicon substrate, an SOI substrate, an sSOI substrate, a XsSOI substrate and a virtual SiGe substrate.

3. The method of production according to one of claims 1 or 2, wherein the step of providing a substrate consists in providing a substrate in which said face comprises at least one component or at least one part of component.

4. The method of production according to claim 1, wherein a ratio of a thickness of the second sacrificial layer over a thickness of the first sacrificial layer is between 1/6 and 20.

5. The method of production according to claim 1, wherein the selective etching of said zone of the first sacrificial layer is at a temperature less than or equal to 700° C.

6. The method of production according to claim 1, wherein a total pressure of the gaseous mixture is between 200 and 101,300 Pa.

7. The method of production according to claim 1, wherein the resin is a HSQ (hydrogen silsesquioxane) resin.

8. The method of production according to claim 1, wherein the material for confining the remaining resin is silicon nitride.

9. The method of production according to claim 1, wherein the step of forming the elements of the components comprises forming at least one transistor gate element.

10. The method of production according to claim 1, wherein the step of selective etching said zone of the second sacrificial layer is followed by a step of filling an etched zone of the second sacrificial layer with an electrically isolating material.

11. The method of production according to claim 10, wherein the electrically isolating material is a silicon oxide.

12. The method of production according to claim 1, further comprising eliminating the material for confining the remaining resin.

13. The method of production according to claim 1, wherein the implementing lithography of the resin deposited in the etched zone of the first sacrificial layer and on the superficial layer is carried out by a beam of electrons passing through the second sacrificial layer.

14. The method of production according to claim 1, wherein the implementing lithography of the resin deposited in the etched zone of the first sacrificial layer and on the superficial layer is carried out by an electromagnetic radiation of wavelength between 0.1 nm and 41 nm, a thickness and nature of the resin deposited on the superficial layer as well as a thickness of the superficial layer being chosen so that at least 50% of the electromagnetic radiation applied to the resin deposited on the superficial layer is transmitted to the resin deposited in the etched zone of the first sacrificial layer.

15. The method of production according to claim 14, wherein the wavelength of the electromagnetic radiation is between 12.5 nm and 15 nm.

* * * * *